(12) United States Patent
Lin (10) Patent No.: US 11,929,242 B2
(45) Date of Patent: *Mar. 12, 2024

(54) SHIELDING MECHANISM AND THIN-FILM-DEPOSITION EQUIPMENT USING THE SAME

(71) Applicant: SKY TECH INC., Hsinchu County (TW)

(72) Inventor: Jing-Cheng Lin, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 70 days.

This patent is subject to a terminal disclaimer.

(21) Appl. No.: 17/525,403

(22) Filed: Nov. 12, 2021

(65) Prior Publication Data

US 2022/0415633 A1 Dec. 29, 2022

(30) Foreign Application Priority Data

Jun. 29, 2021 (TW) ................................. 110123823

(51) Int. Cl.
| | | |
|---|---|---|
| *H01J 37/34* | (2006.01) | |
| *C23C 14/34* | (2006.01) | |
| *C23C 14/54* | (2006.01) | |
| *H01J 37/32* | (2006.01) | |
| *C23C 16/44* | (2006.01) | |

(52) U.S. Cl.
CPC .......... *H01J 37/3447* (2013.01); *C23C 14/34* (2013.01); *C23C 14/54* (2013.01); *H01J 37/32651* (2013.01); *H01J 37/3441* (2013.01); *C23C 16/4405* (2013.01); *H01J 2237/332* (2013.01)

(58) Field of Classification Search
CPC .............. H01J 37/3447; H01J 37/3441; H01J 37/32651; C23C 14/54; C23C 14/34
See application file for complete search history.

(56) References Cited

U.S. PATENT DOCUMENTS

| | | | | |
|---|---|---|---|---|
| 8,021,527 | B2 * | 9/2011 | Miller | H01J 37/3455 204/298.22 |
| 9,627,187 | B2 * | 4/2017 | Ishihara | H01J 37/3447 |
| 11,476,101 | B1 * | 10/2022 | Lin | H01L 21/67028 |
| 11,482,403 | B1 * | 10/2022 | Lin | H01J 37/3444 |
| 11,527,391 | B1 * | 12/2022 | Lin | C23C 14/34 |

(Continued)

FOREIGN PATENT DOCUMENTS

JP 2007131883 A * 5/2007

OTHER PUBLICATIONS

Machine Translation JP 2007131883 A (Year: 2007).*

*Primary Examiner* — Michael A Band
(74) *Attorney, Agent, or Firm* — Chun-Ming Shih; HDLS IPR SERVICES (57) ABSTRACT

The present disclosure provides a shielding mechanism and a thin-film-deposition equipment using the same, wherein the shielding mechanism includes two shield members and a driver. The driver includes a motor and a shaft seal. The motor interconnects the two shield members via the shaft seal, and such that to drive the two shield members to sway in opposite directions and to switch between an open state and a shielding state. Furthermore, each of the two shield members is formed with at least one cavity, for reducing weights thereof and loading of the motor and the driver.

14 Claims, 9 Drawing Sheets

(56) References Cited

U.S. PATENT DOCUMENTS

| | | | |
|---|---|---|---|
| 11,532,469 B1* | 12/2022 | Lin | .......................... C23C 14/34 |
| 2012/0103793 A1* | 5/2012 | Fujii | ................... H01J 37/3447 |
| | | | 204/192.1 |
| 2022/0410202 A1* | 12/2022 | Lin | ......................... B05D 1/322 |
| 2022/0411917 A1* | 12/2022 | Lin | ........................ C23C 14/021 |
| 2022/0415622 A1* | 12/2022 | Lin | ...................... C23C 16/4405 |

* cited by examiner

SHIELDING MECHANISM AND THIN-FILM-DEPOSITION EQUIPMENT USING THE SAME

CROSS-REFERENCE TO RELATED APPLICATIONS

This non-provisional application claims priority claim under 35 U.S.C. § 119(a) on Taiwan invention application No. 110123823 filed on Jun. 29, 2021, the entire contents of which are incorporated herein by reference.

TECHNICAL FIELD

The present disclosure relates to shielding mechanism adapted to a thin-film-deposition equipment, which mainly employs two shield members formed with at least one cavity for reducing weight thereof, and thereby to reduce loading for driving the shield members to operate.

BACKGROUND

Thin-film-deposition equipments, such as chemical-vapor deposition (CVD), physical-vapor deposition (PVD) and the atomic-layer deposition (ALD) equipments, those are commonly employed in manufacturing process of semiconductors, light-emitting diodes and displays, etc.

A thin-film-deposition equipment mainly includes a chamber and a substrate carrier, wherein the substrate carrier is within the chamber for carrying at least one substrate. To exemplify by PVD, a target material is required to dispose within the chamber, wherein the target material faces the substrate on the substrate carrier. When performing PVD, noble gas or reactive gas is transferred into the chamber, then bias electricity is applied on the target material and the substrate carrier respectively, also the substrate carried on by the substrate carrier is heated up.

The noble gas or reactive gas within the chamber transforms into ionized gas in effect of a high-voltage electric field, then the ionized gas is attracted by the bias electricity to bombard the target material. Thereby, atoms or molecules splashed from the target material are attracted by the bias electricity on the substrate carrier, then be deposited on surface of the substrate and forms a thin film on the surface of the substrate.

After some time of usage, an inner-edge surface of the chamber may also be formed with thin film, then a periodic cleaning is required to perform to the chamber, in order to prevent the waste thin film from dropping onto the substrate and causing pollution during the process of thin-film deposition. Moreover, surface of the target material may be formed with oxide or other pollutant, therefore requires a periodic cleaning as well. Generally, a burn-in process is applied to bombard the target material within the chamber by plasma ions, then to remove the oxides or pollutants on the surface of target material.

To perform the abovementioned cleaning process, the substrate carrier and the substrate must be extracted or kept out, to prevent the removed pollutant from turning to pollute the substrate carrier and the substrate, during the cleaning process.

SUMMARY

Generally, after some time of usage, the thin-film-deposition equipment is required for cleaning, in order to remove the waste thin film within the chamber and the oxide or nitride on the target material. During the cleaning process, some removed pollutant particles may turn to pollute the substrate carrier (hereafter as "carrier"), thus there is a need to keep out the substrate carrier from the removed pollutant. The present disclosure provides a shielding mechanism and a thin-film-deposition equipment with the same, which mainly employs a driver to rotate and swing two shield members in opposite rotational directions to approach or leave each other, such that to operate between a shielding state and an open state. Thereby, the shield members in shielding state can cover and shield the substrate carrier, to prevent the removed pollutant particles from turning to pollute the substrate carrier during the process of cleaning the chamber or the target material.

During a process of cleaning the reaction chamber, the driver swings the two shield members to approach each other, such that the two shield members come together to cover the carrier within a containing space, in order to prevent a plasma employed to proceed the cleaning or some removed waste pollutant from turning to pollute the substrate carrier and/or the substrate thereon. Alternatively, during a process of performing the deposition, the driver swings the two shield members to leave each other, such that to permit the process to proceed on the substrate within the reaction chamber.

An object of the present disclosure is to provide a thin-film-deposition equipment using shielding mechanism, which includes a reaction chamber, a carrier and a shielding mechanism. The shielding mechanism includes a driver and two shield members. Also, the driver interconnects the two shield members, for respectively driving the two shield members to sway in opposite directions and thereby to move between an open state and a shielding state.

Each of the two shield members has a surface that faces the carrier, and that is formed with at least one cavity. Thereby, the cavities of the shield members can reduce weights thereof, without causing any undesired effect to a performance of the shield members, and therefore to facilitate the driver in driving and swinging the shield members with less loading.

The driver may interconnect and carry the two shield member via two connecting arms. By virtue of the shield members formed with the cavities, the loading on the connecting arms can be reduced as well. Furthermore, each of the connecting arms may be formed with at least one through hole, this can reduce weights of the connecting arms without weakening their structural strengths, also to further facilitate the driver in driving and swinging the two shield members in the opposite directions via the two connecting arms.

An object of the present disclosure is to provide the aforementioned thin-film-deposition equipment using the shielding mechanism, which further includes two distance sensors that throws optical beams. Furthermore, each of the two connecting arms is disposed with a reflective surface, when the two connecting arms are operated into the shielding state, each of the two distance sensors respectively projects the optical beam on the reflective surface of corresponding one of the connecting arms, such that to detect a distance therebetween and confirm that the two connecting arms are in the shielding state.

An object of the present disclosure is to provide the aforementioned thin-film-deposition equipment, which further includes two position sensors, and wherein the driver includes a shaft seal and a motor. The motor interconnects the two shield members respectively via the outer tube of the shaft seal and the main shaft. The two position sensors are disposed aside the outer tube and/or the main shaft, for detecting that the outer tube and/or the main shaft has rotated to different angles or angular positions, such that to confirm the open state and the shielding state of the two shield members via the different angles or angular positions of the outer tube and/or the main shaft.

To achieve the abovementioned object(s), the present disclosure provides a thin-film-deposition equipment, which includes: a reaction chamber having a containing space; a carrier disposed within the containing space for carrying at least one substrate; and a shielding mechanism. The shielding mechanism includes: a first-shield member disposed and a second-shield member disposed within the containing space, wherein each of the first-shield member and the second-shield member is formed with at least one cavity which faces the carrier; and at least one driver. The driver includes a shaft seal interconnecting the first-shield member and the second-shield member; at least one motor connected to the shaft seal and driving the first-shield member and the second-shield member to sway in opposite directions via the shaft seal, such that the first-shield member and the second-shield member are operated to switch between an open state and a shielding state. When in the open state, the first-shield member and the second-shield member have an open space therebetween, when in the shielding state, the first-shield member and the second-shield member approach each other, for covering the carrier.

The present disclosure also provides a shielding mechanism adapted to thin-film-deposition equipment, which includes: a first-shield member disposed and a second-shield member, wherein each of the first-shield member and the second-shield member is formed with at least one cavity; and at least one driver. The driver includes a shaft seal interconnects the first-shield member and the second-shield member; at least one motor connected to the shaft seal and driving the first-shield member and the second-shield member to sway in opposite directions via the shaft seal, such that the first-shield member and the second-shield member are operated to switch between an open state and a shielding state. When in the open state, the first-shield member and the second-shield member have an open space therebetween, when in the shielding state, the first-shield member and the second-shield member approach each other.

Moreover, the present disclosure also provides the aforementioned thin-film-deposition equipment and shielding mechanism, wherein the at least one driver is two as a first driver and a second driver. The first driver has the motor thereof connected to the first-shield member via the shaft seal thereof, for driving and swinging the first-shield member. The second driver has the motor thereof connected to the second-shield member via the shaft seal thereof, for driving and swinging the second-shield member. Thereby, the first driver and the second driver respectively drive and swing the first-shield member and the second-shield member in the opposite directions and to switch between the open state and the shielding state.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
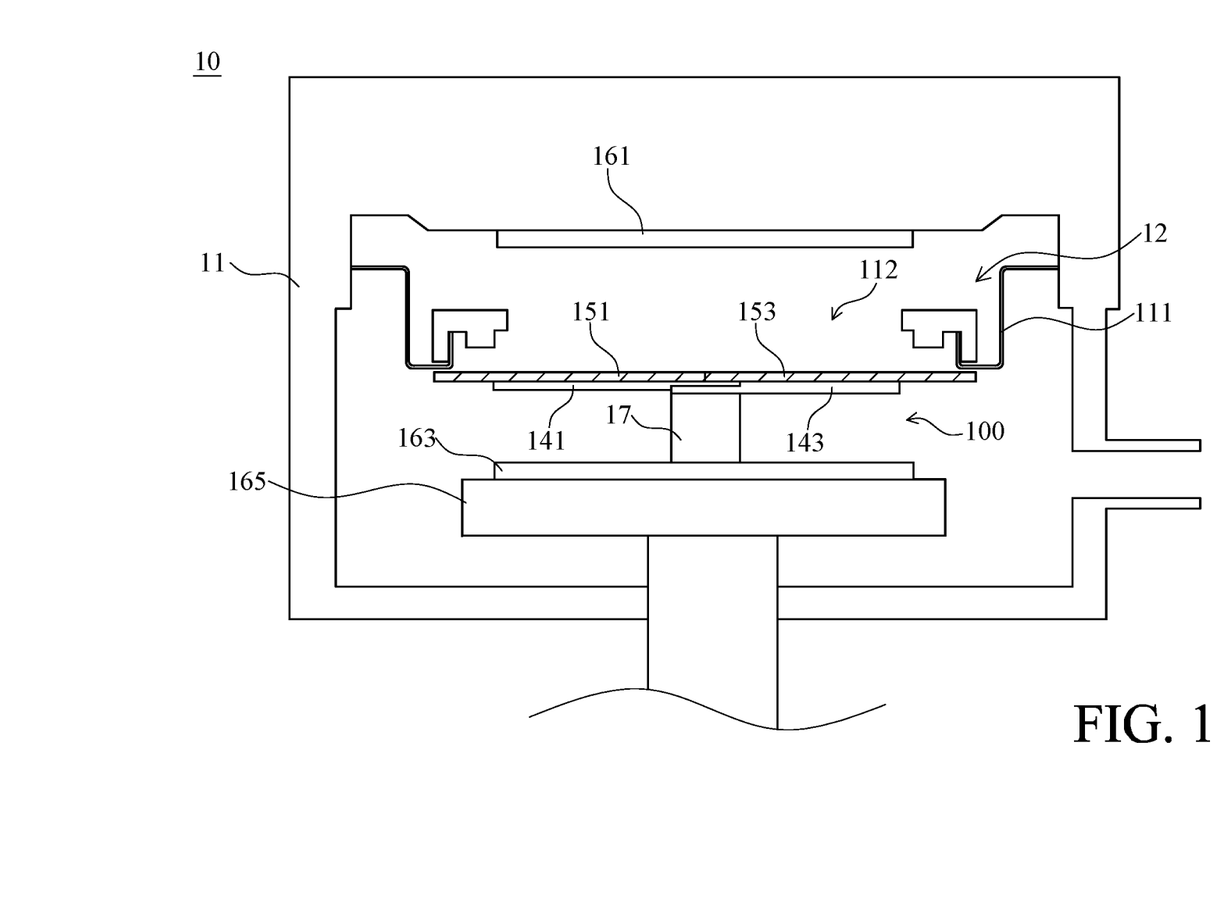
FIG. 1 is a schematic cross-sectional view illustrating a thin-film-deposition equipment for detecting shielding mechanism which is operated into a shielding state, according to one embodiment of the present disclosure.

Referring to FIG. 1, which is a schematic sectional view illustrating of a thin-film-deposition equipment for detecting shielding mechanism 10 which is operated in a shielding state, according to one embodiment of the present disclosure. As shown in the FIG, the thin-film-deposition equipment with shielding mechanism 10 (hereafter as "the thin-film-deposition equipment 10") mainly includes a reaction chamber 11, a carrier 165 and a shielding mechanism 100, wherein the reaction chamber 11 includes a containing space 12 for containing the carrier 165 and a portion of the shielding mechanism 100.

The carrier 165 is positioned within the containing space 12 of the reaction chamber 11, for carrying at least one substrate 163. In this embodiment, the thin-film-deposition equipment 10 is exemplified as a physical-vapor deposition chamber. The reaction chamber 11 is disposed within a target material 161 and has the target material 161 facing the carrier 165. Specifically, the target material 161 may be disposed on a ceiling surface of the reaction chamber 11 to face the carrier 165 and/or the substrate carried thereon within the containing space 12, for example.

Figure 2:
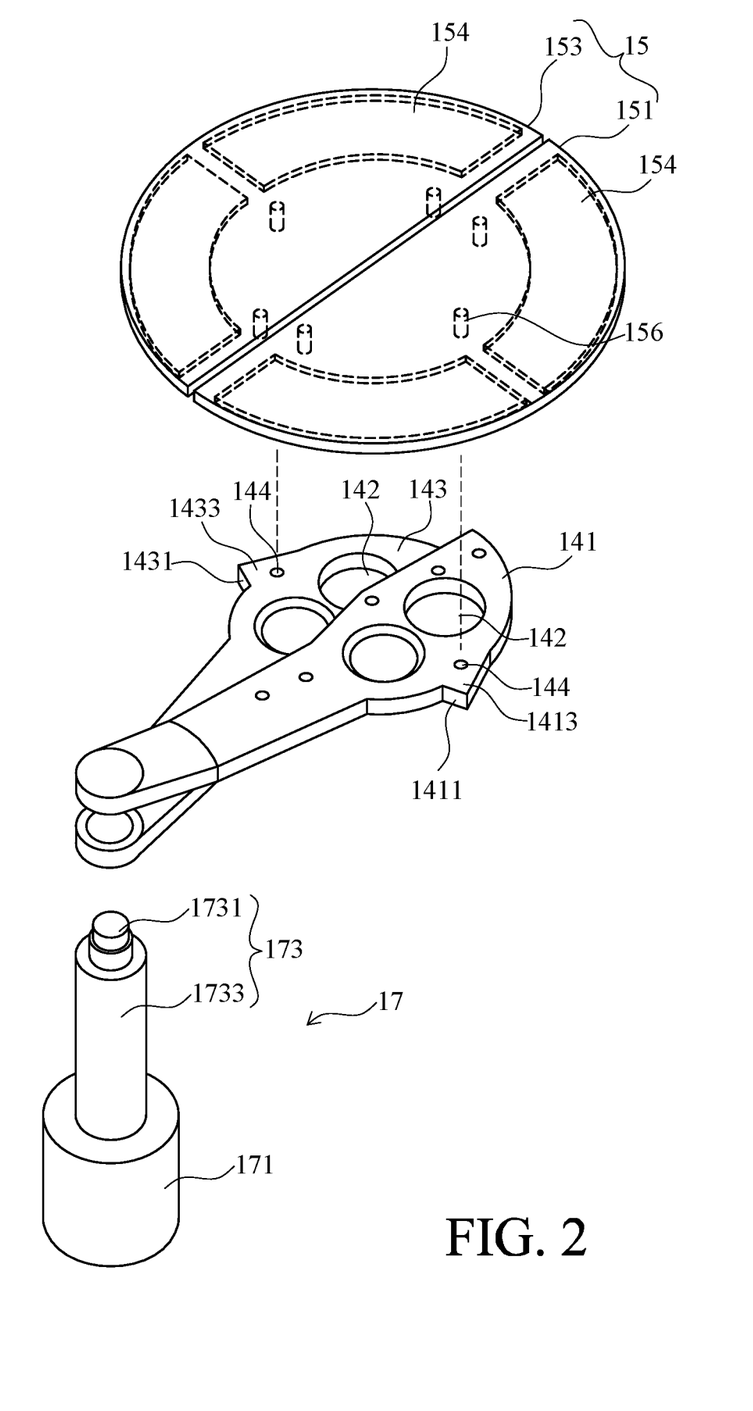
FIG. 2 is a schematic perspective exploded view illustrating the shielding mechanism according to one embodiment of the present disclosure.

Referring to FIG. 2, the shielding mechanism 100 includes a first-shield member 151, a second-shield member 153 and a driver 17, wherein the two shield members 151, 153 are disposed within the containing space 12. The driver 17 power-transmittably interconnects the first-shield member 151 and the second-shield member 153, such that to drive, swing the first-shield member 151 and the second-shield member 153 in opposite direction (rotational directions), such as to have the two shield members 151, 153 swaying toward or away from each other synchronously, about an axle of the driver 17. Thereby, the driver 17 can drive and swing the two shield members 151, 153 away from each other into an open state, for the thin-film-deposition equipment 10 to perform a deposition process to the substrate 163 carried by the carrier 165. In an opposite manner, the driver 17 can drive and swing the two shield members 151, 153 toward each other into a shielding state and form a whole shield 15, for the thin-film-deposition equipment 10 to perform a cleaning process, wherein the two shield members 151, 153 together cover the carrier 165 to prevent removed pollutants from turning to pollute the carrier 165.

Specifically, a manner of the first-shield member 151 and the second-shield member 153 being operated into the shielding state as the whole shield 15, which is defined as the first-shield member 143 of the first-shield member 151 and the second-shield member 153 of the second-shield member 153 continue to approach each other, until a distance between the two shield members 151, 153 is less than a threshold value, such as 1 millimeter (mm). To be specific, the first-shield member 151 and the second-shield member 153 do not actually contact each other, such that to avoid a collision or friction therebetween, which may create some wear-off particles therefrom to pollute the containing space 12 of the reaction chamber 11 and/or the carrier 165 therein.

Figure 3:
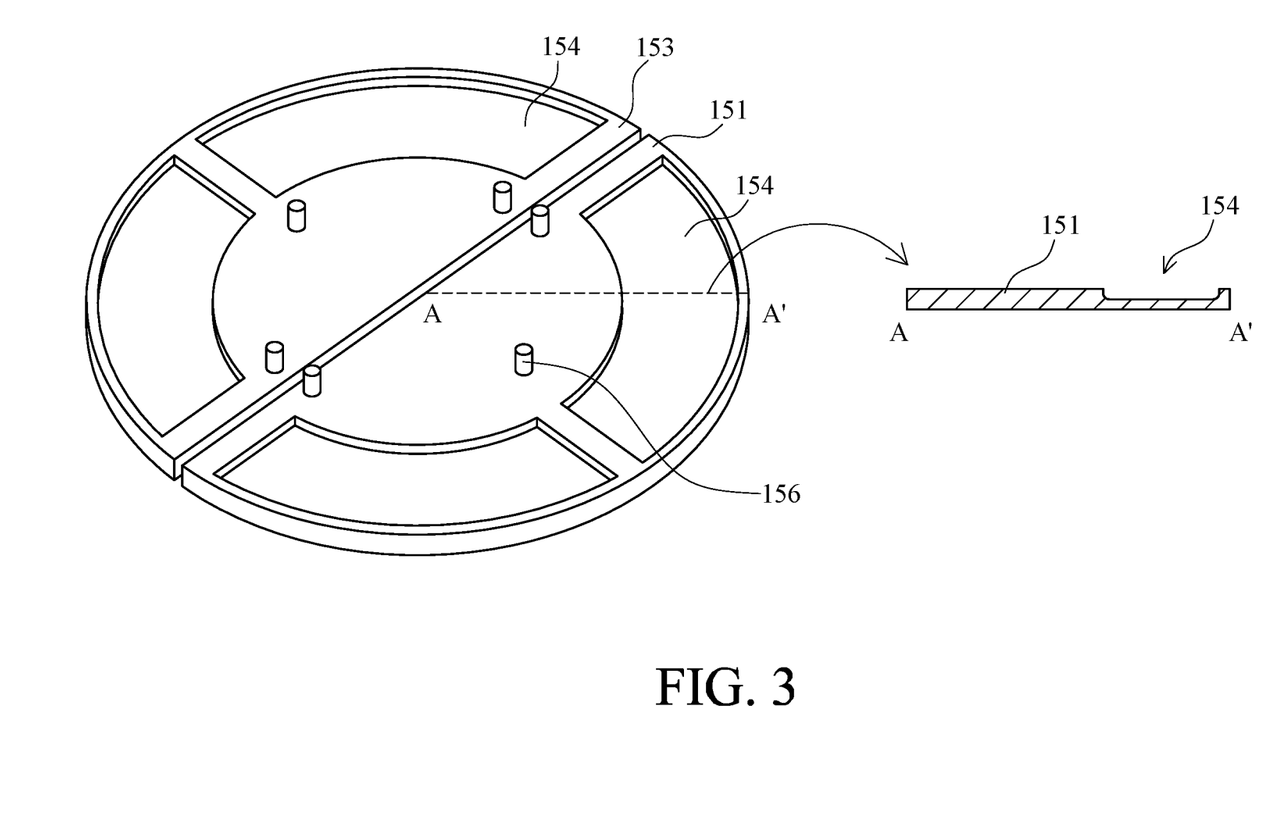
FIG. 3 is a schematic perspective illustrating two shield members of the shielding mechanism sectional view illustrating two shield members of the shielding mechanism with a cross-sectional view taken along line A-A', according to one embodiment of the present disclosure.

Moreover, as shown in FIG. 3, each of the first-shield member 151 and the second-shield member 153 has a surface that may be formed with at least one cavity 154. By virtue of the cavities 154, it is able to reduce weights of the first-shield member 151 and the second-shield member 153, without causing undesired effect to a performance of the first-shield member 151 and the second-shield member 153. To achieve that, the two shield members 151, 153 may be made of certain material such as titanic, also, each of the cavities 154 is formed with a depth proximately between 30% (percent) and 70% of a thickness of each of the shield members 151, 153, furthermore, each of the cavities 154 may be formed with a cross-sectional areas proximately between 30% and 70% of that of each of the shield members 151, 153. In addition, each of the cavities 154 is formed with fillets or bevels at a bottom or corners thereof.

Specifically, each of the first-shield member 151 and the second-shield member 153 may be formed proximately as a half-round plate, and thereon, each of the cavities 154 may be formed in curved shape (half-circular or quarter-circular) and disposed nearby an outer edge of a corresponding one of the shield members 151, 153. Also, the cavities 154 may be disposed on the shield members 151, 153 in a balanced, symmetric manner, such that to prevent changing, biasing center masses of the shield members 151, 153.

In one embodiment, the first-shield member 151 and the second-shield member 153 are configured to be operated into the shielding state for a coverage of the carrier 165, wherein, each of the first-shield member 151 and the second-shield member 153 has the aforementioned surface as bottom surface (downside of FIG. 2) which faces the carrier 165, and which is formed with the cavity 154. Such that, the cavities 154 are also disposed to face the carrier 165, in order to avoid causing any undesired effect to the coverage performance of the shield members 151, 153 during the cleaning process.

In one embodiment, the shielding mechanism 10 may further include a first-connecting arm 141 for carrying the first-shield member 151, and a second-connecting arm 143 for carrying the second-shield member 153, wherein each of the first-connecting arm 141 and the second-connecting arm 143 may be formed with a scissor-like appearance. Therewith, the driver 17 power-transmittably interconnects the two shield members 151, 153 respectively via the two connecting arms 141, 143, for driving and swinging the first-shield member 151 and the second-shield member 153 to move in the opposite direction. As the first-connecting arm 141 and the second-connecting arm 143 are for carrying the first-shield member 151 and the second-shield member 153, by virtue of the cavities 154 which reduce, lighten the weights the two shield members 151, 153, the two connecting arms 141, 143 can hence have less loading and avoid bending out of shape or breaking-off.

Figure 4:
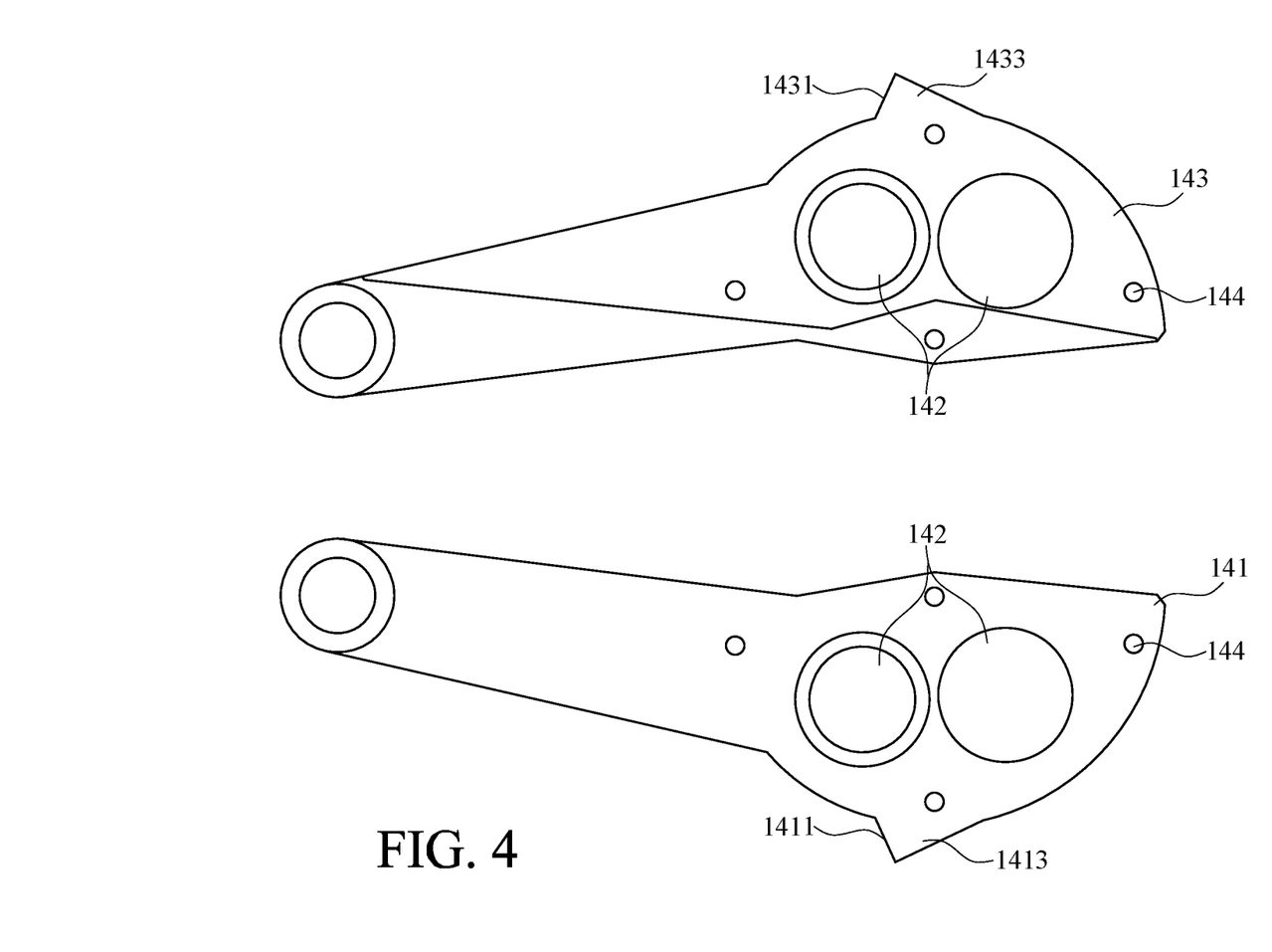
FIG. 4 is a schematic top view illustrating two connecting arms of the shielding mechanism, according to one embodiment of the present disclosure.

Also referring to FIG. 4, each of the first-connecting arms 141 and the second-connecting arm 143 are formed with at least one through hole 142, for reducing a weight thereof. It should be noted, the through holes 142 on the connecting arms 141, 143 are disposed and configured in a manner that does not weaken, reduce a structural strength of each of the first-connecting arm 141 and the second-connecting arm 143.

In one embodiment of the present disclosure, each of the first-shield member 151 and the second-shield member 153 may be disposed with a plurality of shield positioners 156 on the bottom surface thereof, the same surface formed with the cavities 154, for example. Along therewith, each of the first-connecting arm 141 and the second-connecting arm 143 has a top surface (upside of FIG. 2) that is for respectively carrying the first-shield member 151 and the second-shield member 153, and that is disposed with a plurality of arm positioners 144. In this embodiment, the shield positioners 156 are pins protruding from the bottom surfaces of the shield members 151, 153, on the other side, the arm positioners 144 are slots opened on the top surfaces of the connecting arms 141, 143 for engaging with the shield positioners 156. Such that, the first-shield member 151 can be positioned on the first-connecting arm 141 by the engagement of the shield positioners 156 and the arm positioners 144 therebetween, in the other hand, the second-shield member 151 can be positioned on the second-connecting arm 143 by the engagement between the shield positioners 156 and the arm positioners 144 therebetween, thereby to prevent relative displacement between the shield members 151, 153 and the connecting arms 141, 143.

However, the abovementioned configuration of the shield positioners 156 and the arm positioners 144 are merely one of the embodiments, claim scope of the present disclosure is not limited thereto. In an alternative embodiment, the shield positioners 156 may be configured as slots, and the arm positioners 144 may be configured as pins. Moreover, in a different embodiment, the connecting arms 141, 143 may be formed with bolt holes in advance, and the arm positioners 144 are bolts fastened into the bolt holes as pins the top surface thereof, such that to engage with the shield positioners 156 as slots on the bottom surface of the shield members 151, 153 for positioning.

Figure 5:
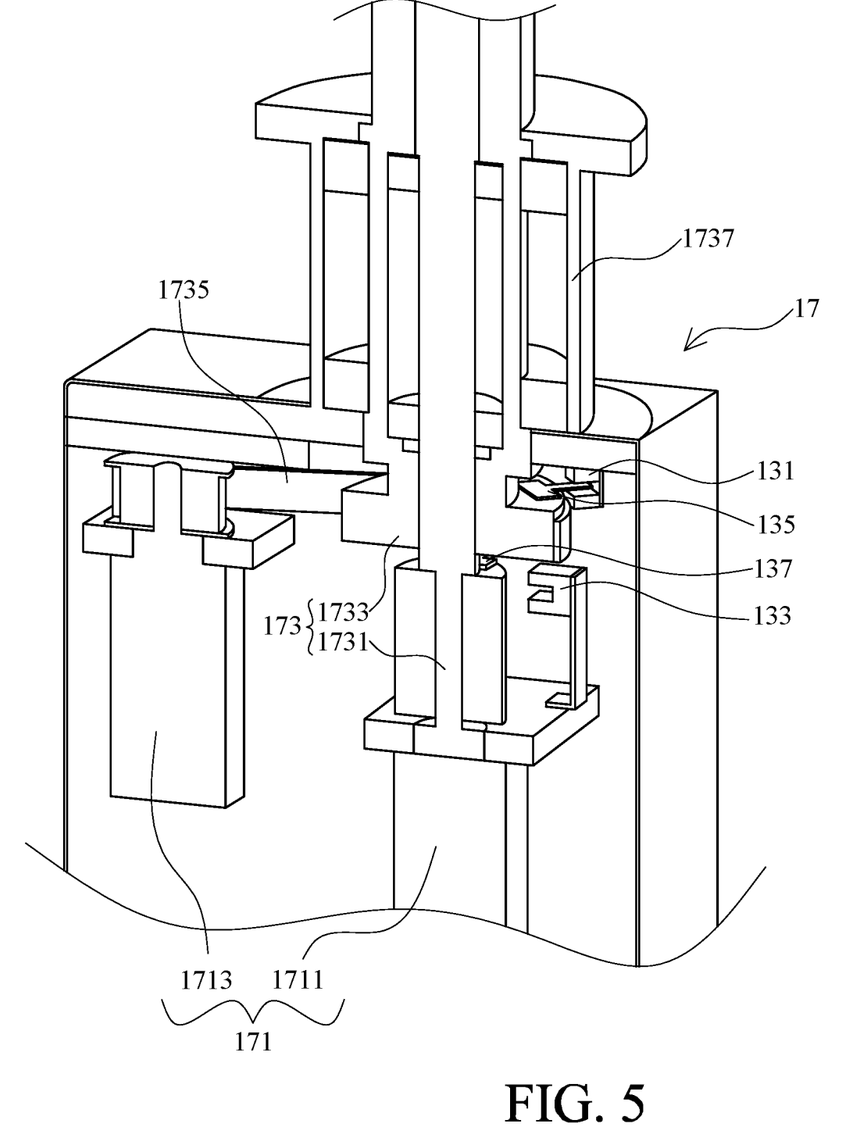
FIG. 5 is a schematic fragmentary perspective cross-sectional view illustrating a driver of the shielding mechanism, according to one embodiment of the present disclosure.

In one embodiment of the present disclosure, as shown in FIG. 5, the driver 17 includes a motor 171 and a shaft seal 173, wherein the motor 171 is power transmittably connected to the first-shield member 151 and the second-shield member 153 via the shaft seal 173, such that to respectively drive and swing the two shield members 151, 153 in the opposite directions via the shaft seal 173, and to switch into the open state and the shielding state.

In more detail, the shaft seal 173 includes an outer tube 1733, and a main shaft 1731 contained within the outer tube 1733, also, the outer tube 1733 and the main shaft 1731 are disposed in a coaxial manner and are rotatable relative to each other. The motor 171 is power-transmittably connected to the first-connecting arm 141 via the main shaft 1731, such that to drive and turn the main shaft 1731 to rotate and hence to swing the first-connecting arm 141 and the first-shield member 151 thereon. In the other hand, the motor 171 is power-transmittably connected to the second-connecting arm 143 via the outer tube 1733, such that to drive and turn the outer tube 1733 to rotate and hence to swing the second-connecting arm 143 and the second-shield member 153 thereon. Thereby, the motor 171 respectively turns the outer tube 1733 and the main shaft 1731 to rotate in the opposite directions, and hence to swing the two shield members 151, 153 between the shielding state and the open state.

The shaft seal 173 may be a common shaft seal component, which is mainly for isolating the containing space 12 of the reaction chamber 11 from an outside thereof and maintaining a vacuum condition within the containing space 12. In one embodiment as shown in FIG. 5, the shaft seal 173 may further include a stationary tube 1737 surrounding and containing the outer tube 1733 and the main shaft 1731 within, wherein the outer tube 1733 is connected to the stationary tube 1737 via bearings and in a relatively rotatable manner, also, the main shaft 1731 is connected to the outer tube 1733 via bearings and in a relatively rotatable manner, In a different embodiment of the present disclosure, the shaft seal 173 may be a magnetic liquid rotary sealing, which includes a plurality of bearings, at least one permanent magnet, at least one pole piece and at least one ferrofluid.

As shown in FIG. 2, the motor 171 may be a single one to drive and turn the outer tube 1733 and the main shaft 1731 of the shaft seal 173 in the opposite direction, via a gear mechanism (not shown), for example. In a different embodiment as shown in FIG. 5, the motor 171 may be two as a first motor 1711 and a second motor 1713, wherein the first motor 1711 is power-transmittably connected to the main shaft 1731, on the other side, the second motor 1713 is power-transmittably connected to the outer tube 1733 of the shaft seal 173 via a transmission unit 1735 (e.g. conveyor belt). Such that, the first motor 1711 and the second motor 1713 respectively drive and swing the first-shield member 151 and the second-shield member 153 in the opposite directions, via the main shaft 1731 and the outer tube 1733.

In general, it is able to predict and to know a rotational angle or angular position of the main shaft 1731 by calculating a rotational angle of the first motor 1711, in the other hand, a rotational angle or angular position of the outer tube 1733 can also be predicted by calculating a rotational angle of the second motor 1731, in a similar manner. However, as the second motor 1713 drives and turns the outer tube 1733 indirectly via the transmission unit 1735, the transmission unit 1735 may slip related to the second-motor 1713 and the outer tube 1733 during the process, and thereby, it is unable to accurately predict and confirm that the outer tube 1733 has rotated to a preset angle or position from the rotational angle of the second motor 1713, and hence unable to ensure that the two shield members 151, 153 have been operated into the shielding state or the open state.

Along therewith, the shielding mechanism 100 in this embodiment also includes the two first-position sensors 131, which are disposed adjacent to the outer tube 1733 of the shaft seal 173. In more detail, the two first-position sensors 131 have a distance therebetween, such as to be disposed at different angular positions about an axis of the outer tube 1733. To be specific, one of the two first-position sensors 131 is for detecting and confirming if the outer tube 1733 has rotated to a first position (e.g. an angular position or direction angle) or not, and another one of the two first-position sensors 131 is for detecting and confirming if the outer tube 1733 has rotated to a second position (e.g. an angular position or direction angle) or not.

In this embodiment, when the outer tube 1733 rotates to the first position, the second-shield member 153 connected thereto is operated into the open state, and when the outer tube 1733 rotates to the second position, the second-shield member 153 is operated into the shielding state. Basically, the outer tube 1733 and the second-shield member 153 are fastened to each other thus no relative movement or rotation therebetween. Therefore, it is enough to confirm and ensure the second-shield member 153 is in the shielding state or the open state, when one of the first-position sensors 131 detected that the outer tube 1733 has rotated to the first position or the second position.

Furthermore, in an advanced embodiment of the present disclosure, the shielding mechanism 100 may be further disposed with two second-position sensors 133 adjacent to the main shaft 1731 of the shaft seal 173. Similar to the first-position sensors 131, the two second-position sensors 133 also have a distance therebetween and are disposed at different angular positions about an axis of the mean shaft 1731, wherein one of the two second-position sensors 133 is for detecting and confirming if the main shaft 1731 has rotated to a third position (e.g. an angular position or direction angle) or not, and another one of the two second-position sensors 133 is for detecting and confirming if the main shaft 1731 has rotated to a fourth position (e.g. another angular position or direction angle) or not. In this embodiment, the shielding mechanism 100 is configured in a manner that when the main shaft 1731 rotates to the third position, the second-shield member 153 connected thereto is operated into the open state, and when the main shaft 1731 rotates to the fourth position, the first-shield member 151 is operated into the shielding state, such that to confirm the first-shield member 151 is in the shielding state or the open state, by the second-position sensors 133 to detect the third position or the fourth position of the main shaft 1731.

Figure 6:
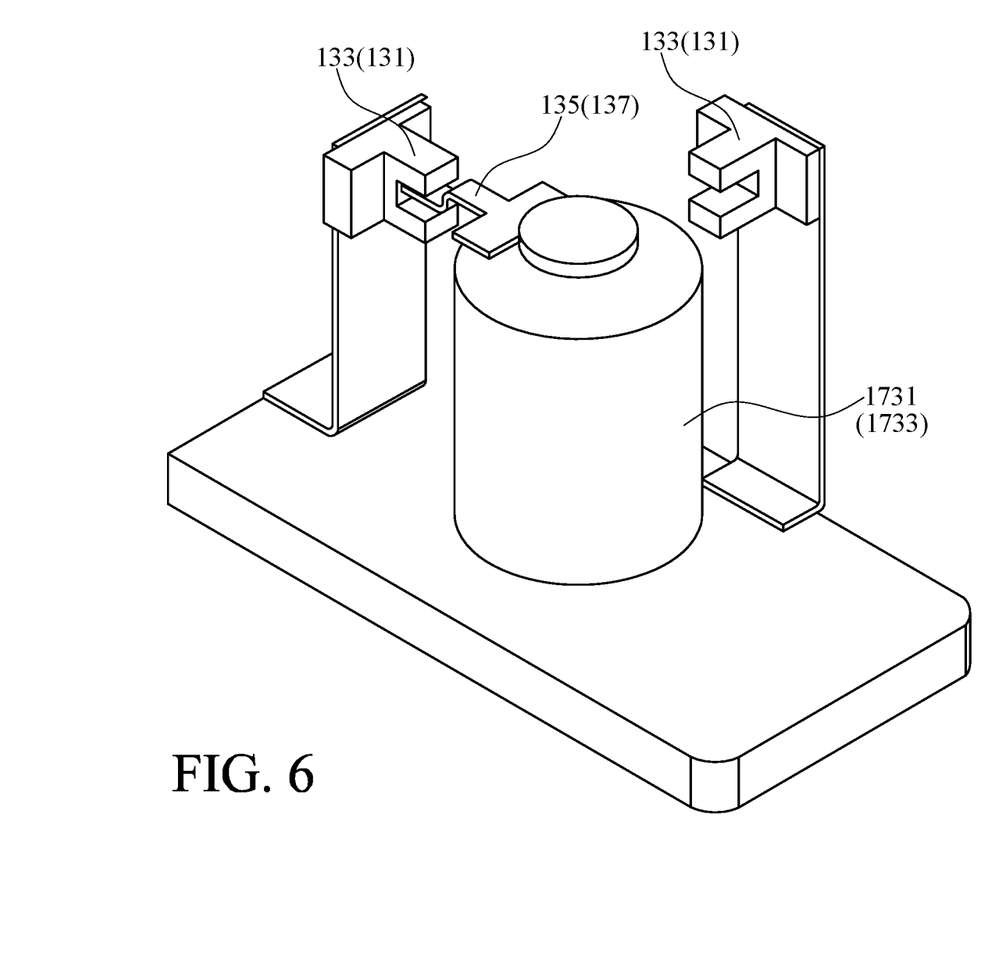
FIG. 6 is a schematic fragmentary perspective view illustrating the driver of the shielding mechanism, according to one embodiment of the present disclosure.

In more detail, as shown in FIG. 6, the first-position sensors 131 may be such as through-beam sensors, each of which includes an emitter emitting and throwing a through beam and a receiver receiving the through beam. Also, the outer tube 1733 may be disposed with a first-tongue unit 135 which protrudes radially-outward therefrom. For example, the first-tongue unit 135 may be a plate or sheet formed with a pointing end and fastened on the outer tube 1733 by bolt(s) or welding, etc. With such arrangement, when the outer tube 1733 rotates, the first-tongue unit 135 also turns to have the pointing end thereof to intersect the through beam of the corresponding first-position sensors 131 and be detected thereby, and such that the first-position sensors 131 can aid to respectively confirm the open state and the shielding state of the second-shield member 153.

Similar to the first-position sensors 133, the second-position sensors 133 may be such as through-beam sensors. Along therewith, the main shaft 1731 may be disposed with a second-tongue unit 137, which is similar to the first-tongue unit 135 and which protrudes radially-outward therefrom. Such that, when the main shaft 1731 rotates, the second-tongue unit 137 also turns and has a pointing end thereof to intersect, block a through beam of the second-position sensors 133 and be detected thereby, and such that the second-position sensors 133 can aid to respectively confirm the open state and the shielding state of the first-shield member 151.

Figure 7:
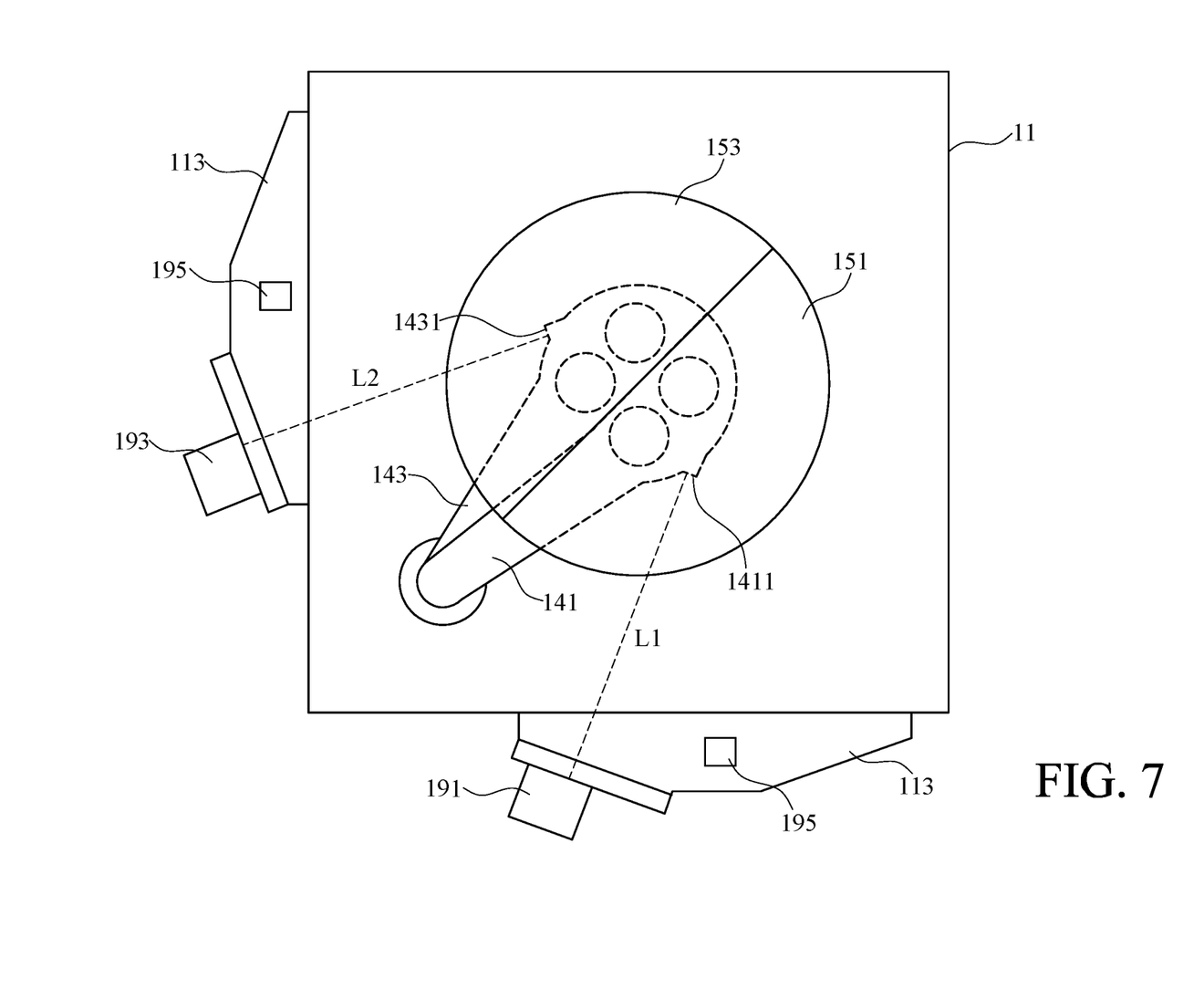
FIG. 7 is a schematic top internal view illustrating the thin-film-deposition equipment with the shielding mechanism operated into the shielding state, according to one embodiment of the present disclosure.

In a further advanced embodiment, According to the present disclosure, as shown in FIG. 2, FIG. 4 and FIG. 7, the thin-film-deposition equipment 10 has the first-connecting arm 141 disposed with a first-reflective surface 1411, and has the second-connecting arm 143 is disposed with a second-reflective surface 1431. Furthermore, the thin-film-deposition equipment 10 includes a first-distance sensor 191 and a second-distance sensor 193 disposed on the reaction chamber 11, for respectively detecting the first-shield member 151 and the second-shield member 153 to confirm the shielding state thereof. In practical use, the first-distance sensor 191 and the second-distance sensor 193 may be optical rangefinders.

Moreover, the first-connecting arm 141 includes a first protrusion 1413 with the first-reflective surface 1411 thereon, in the other hand, the second-connecting arm 143 may include a second protrusion 1433 with the second-reflective surface 1431 formed thereon, such that to form specific portions, areas for the distance sensors 191, 193 to aim and detect.

The first-distance sensor 191 is disposed on side of the first-shield member 151, wherein the first-distance sensor 191 emits and projects a first-optical beam (L1) onto the first-shield member 151. In practical use, a position of the first-distance sensor 191 may be configured, to have the first-optical beam (L1) thereof projected right on the first-reflective surface 1411 of the first-connecting arm 141 when the first-shield member 151 into the shielding state. At this moment, the first-optical beam (L1) of the first-distance sensor 191 is threw by an emitter thereof and perpendicularly projected on the first-reflective surface 1411 (parallel to a normal line of the surface 1411), and then reflected by the first-reflective surface 1411 and returns to a receiver of the first-distance sensor 191. Such that, the first-distance sensor 191 can measure a distance between the first-shield member 151 and the first-distance sensor 191 itself, by such as estimating a time duration from the throw of the first-optical beam (L1) to the return of the first-optical beam (L1), or a reflective angle between the threw first-optical beam (L1) and the reflected first-optical beam (L1), etc. Thereby, the first-distance sensor 191 can confirm that the first-shield member 151 has been operated into the shielding state when the distance substantially matches to a preset value corresponding to the shield state.

Similar to the first-distance sensor 191, the second-distance sensor 193 is disposed on side of the second-shield member 153, and projects a second-optical beam (L2) onto the second-reflective surface 1431 of the second-connecting arm 143. At this moment, the second-optical beam (L2) of the second-distance sensor 193 is perpendicularly projected on the second-reflective surface 1431, and then reflected by the second-reflective surface 1431 back to the second-distance sensor 193. Such that, the second-distance sensor 193 can measure a distance between the second-shield member 153 and the second-distance sensor 193 itself by the reflected second-optical beam (L2), and hence to confirm that the second-shield member 153 has been operated into the shielding state.

Figure 8:
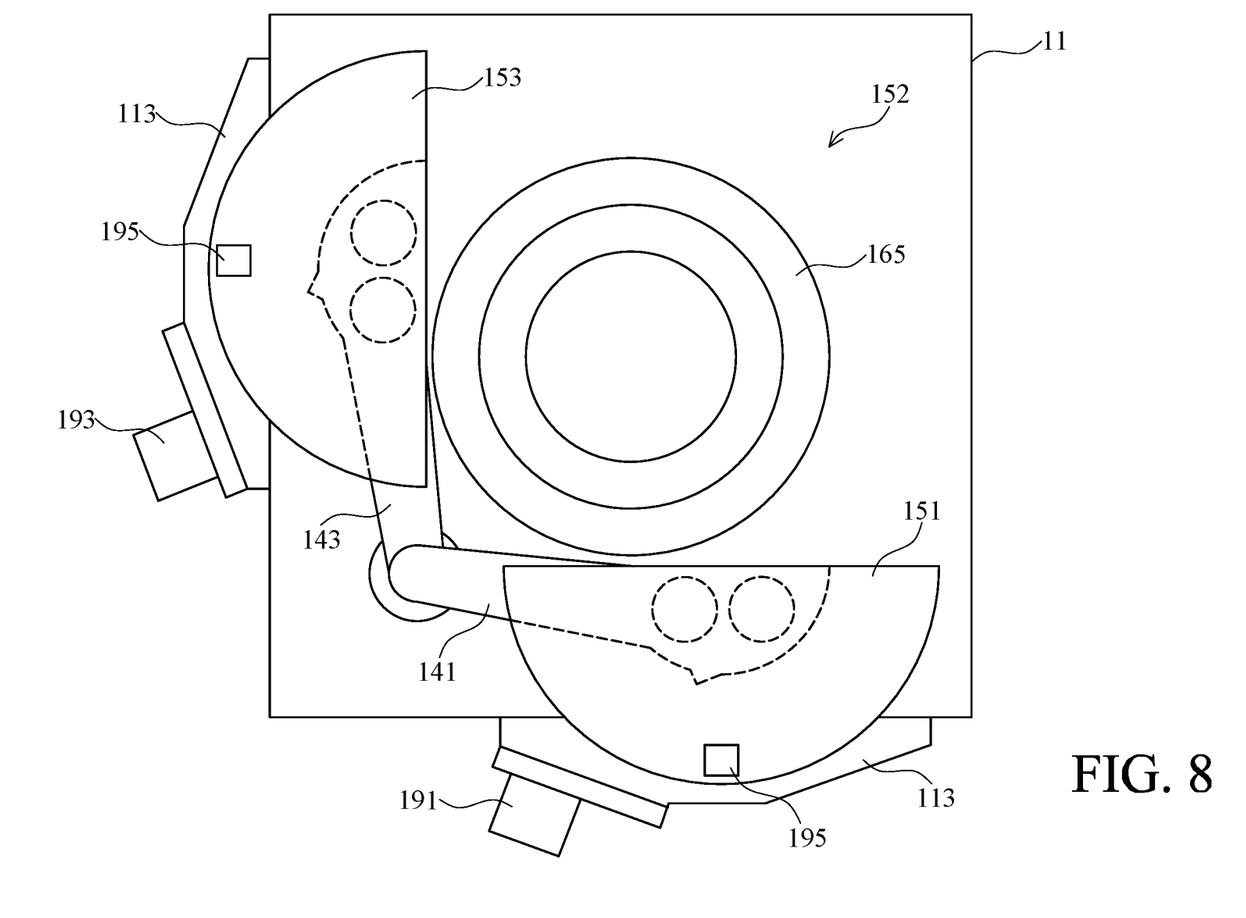
FIG. 8 is a schematic top internal view illustrating the thin-film-deposition equipment with the shielding mechanism operated into an open state, according to one embodiment of the present disclosure.

In one embodiment of the present disclosure, as shown in FIG. 7 and FIG. 8, the reaction chamber 11 includes two sensor areas 113 which are connected to and which protrude from two sides of the reaction chamber 11 respectively. In more detail, each of the sensor areas 113 is formed with a hollow sensing space therein which is spatially and fluidly connected to the containing space 12 of the reaction chamber 11, for partially containing the first-shield member 151 of the first-shield member 153 and the first-shield member 153 of the second-shield member 153 respectively when the two shield members 151, 153 are operated into the open state.

Moreover, in practical use, each of the sensing spaces of the sensor areas 113 may also be disposed with a shield sensor 195 (e.g. through-beam sensors), for respectively detecting and confirming that the first-shield member 151 and the second-shield member 153 have been operated into the open state, when each of the two shield members 151, 153 respectively enters a corresponding one of the sensing spaces and intersects a signal (e. g. through beam) of the shield sensor 195 there. Thereby, as shown in FIG. 8, the two shield member can separate from each other and have an enough open space 152, for the carrier 165 to move and operate the later performed thin-film deposition process to the substrate 163 thereon. Also to mention that, each of the sensor areas 113 has a height (thickness in up-down direction) shorter than that of the reaction chamber 11, such that to facilitate mounting the shield sensors 195 from outside of the reaction chamber 11.

In a more specific embodiment of the present disclosure as shown in FIG. 1, the containing space 12 of the reaction chamber 11 may be disposed with a tubular blocking member 111, which has one end connected to a ceiling surface (upside of FIG. 1) of the reaction chamber 11, and another end formed with an opening 112. With such structure, as the two shield members 151, 153 be operated into the open state, the carrier 165 can extend (by certain mechanism made of motor, leadscrew or gears, etc.) to approach the target material 161, the carrier 165 may further enter the opening 112 or contacts the blocking member 111. The reaction chamber 11, the carrier 165 and the blocking member 111 together define a reacting space within the containing space 12, for forming the thin film on the substrate 163 within the reactive space, such that to prevent the blew-off particles of the target material 161 from spreading out of the reactive space and forming undesired thin film outside.

In the opposite manner, the carrier 165 can return and leave the target material 161 also the opening 112 of the blocking member 111, thereafter, the two shield members 151, 153 may be operated into the shielding state for a coverage of the carrier 165 (may also with the substrate 163 thereon). Along therewith, a burn-in process is then performed within the reacting space (inside of the blocking member 111), to clean the target material 161, the ceiling surface of the reaction chamber 11 and/or an inside of the blocking member 111, in order to remove oxides, nitrides or other pollutants on the target material 161, also to remove undesired, waste thin film within the reaction chamber 11 and/or the blocking member 111.

Figure 9:
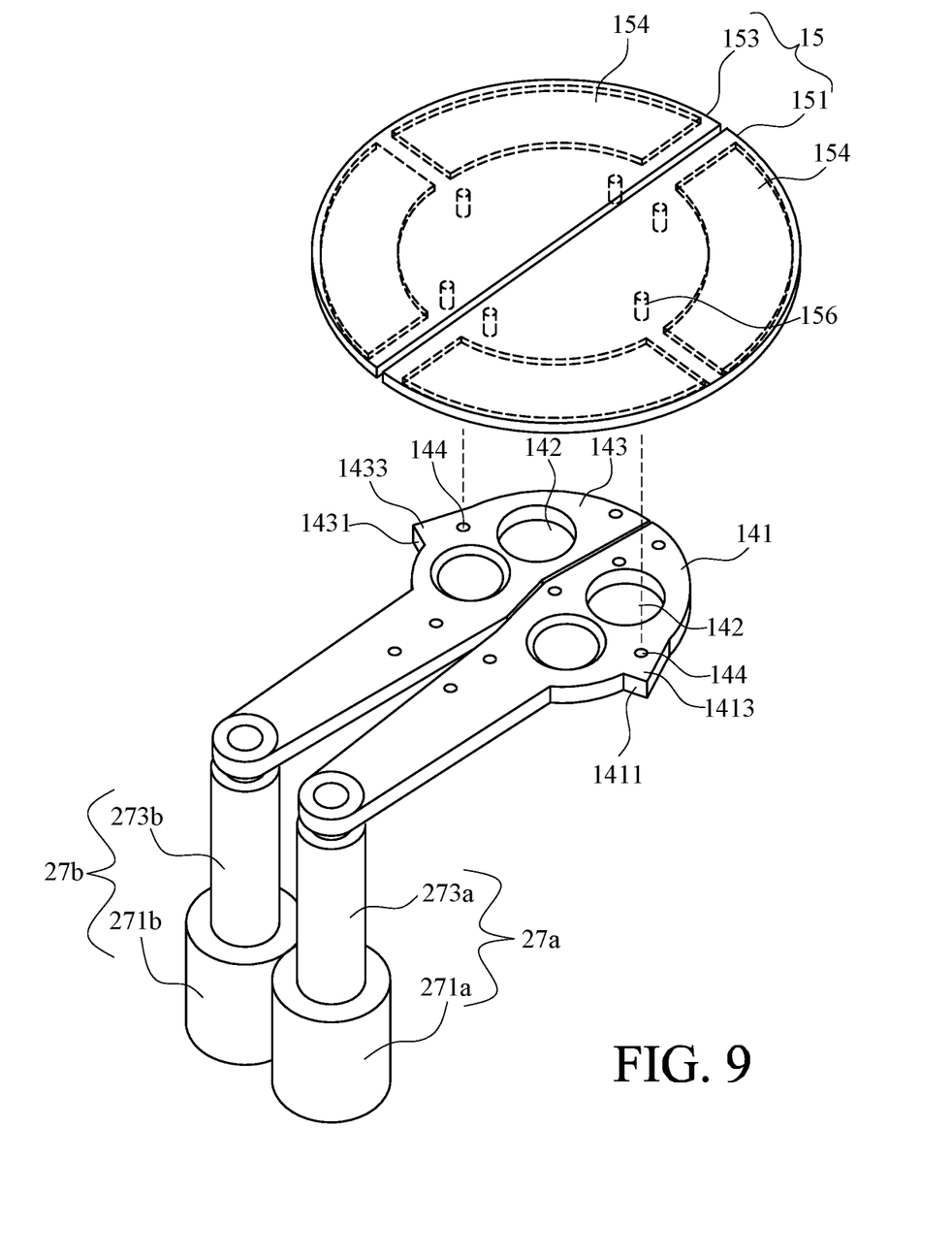
FIG. 9 is a schematic perspective exploded view illustrating the shielding mechanism, according to another embodiment of the present disclosure.

Furthermore, referring to FIG. 9, which is a schematic perspective exploded view illustrating the shielding mechanism, according to another embodiment of the present disclosure. In comparison with the aforementioned embodiment, the driver in this embodiment becomes two, as a first driver 27a and a second driver 27b. The first driver 27a and the second driver 27b are respectively connected power-transmittably to the first-shield member 151 and the second-shield member 153 via the first-connecting arm 141 and the second-connecting arm 143, such that to drive and swing the two shield members 151, 153 to move, sway in the opposite directions. For example, the first-shield member 151 and the second-shield member 153 may synchronously sway in the opposite directions, respectively about an axle of the first driver 27a and an axle of the second driver 27b.

In more detail, each of the first driver 27a and the second driver 27b includes at least one motor 271a, 271b and a shaft seal 273a, 273b, which are structures similar to the aforementioned single motor 171 and shaft seal 173. Such that, the motor 271a, 271b of the two drivers 27a, 27b can respectively drive and turn the shaft seals 273a, 273b to rotate in the opposite directions, and hence to further swing the first-shield member 151 and the second-shield member 153 thereon to move into the open state or into the shielding state, as well.

Similar to the aforementioned embodiment, the first-connecting arm 141 driven by the first driver 27a has the first-reflective surface 1411 thereon to be detected by the first-distance sensor 191 (FIG. 7), in the other hand, the second-shield member 153 driven by the second driver 27b has the second-reflective surface 1431 thereon to be detected by the second-distance sensor 193 (FIG. 7), such that to detect and confirm the shielding state of the shield members 151, 153.

Moreover, similar to the embodiment of FIG. 5 and FIG. 6, in an advanced embodiment, the first driver 27a may has the shaft seal 273a thereof disposed with the second-tongue unit 137, in the other hand, the second driver 27b may has the shaft seals 273b thereof disposed with the first-tongue unit 135, also combine with the first-position sensors 131 and the second-position sensors 133 to respectively detect the first-tongue unit 135 and the second-tongue unit 137, wherein the first-position sensors 131 detects the first-tongue unit 135 corresponding to the second-shield member 153, the second-position sensors 133 detects the second-tongue unit 137 corresponding to the first-shield member 151. Such that, as the two drivers 27a, 27b respectively drive and swing the two shield members 151, 153 into the shielding state or the open state, each of the position sensors 131, 133 can aid to detect that each of the shaft seals 273a, 273b has rotated to their preset positions (similar to the aforementioned first and second positions, or third and fourth positions), and thus to confirm the shielding state and the open state of the two shield members 151, 153.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

We claim:

1. A thin-film-deposition equipment, comprising:
   a reaction chamber comprising a containing space, with a target material disposed on a ceiling surface of the reaction chamber;
   a carrier disposed within the containing space for carrying at least one substrate thereon, and the target material facing the carrier; and
   a shielding mechanism comprising:
      a first-shield member that is disposed within the containing space;
      a second-shield member that is disposed within the containing space, wherein each of the first-shield member and the second-shield member is formed as a half-round plate, and both of the first-shield member and the second-shield member are formed with at least one cavity facing the carrier to reduce weights of the first-shield member and the second-shield member, wherein the first-shield member and the second-shield member are arranged on a same plane; and
      a first-connecting arm for carrying the first-shield member; and
      a second-connecting arm for carrying the second-shield member;
      at least one driver that comprises:
         a shaft seal which interconnects the first-shield member and the second-shield member; wherein the shaft seal comprises an outer tube and a main shaft contained within the outer tube;
         at least one motor which is connected to the shaft seal and which respectively drives and swings the first-shield member and the second-shield member in opposite directions synchronously to switch between an open state and a shielding state via the shaft seal;
      wherein in the open state, the first-shield member and the second-shield member swing away from each other to have an open space therebetween to expose the carrier to the target material; and
      wherein in the shielding state, the first-shield member and the second-shield member approach each other to form a round plate as a whole shield to shield the carrier to cover the carrier, wherein the first shield member and the second shield member operating in the shielding state are not in direct contact to form a distance therebetween in the same plane that the first shield member and the second shield member are arranged on, and the distance is less than 1 mm;
      wherein the main shaft is connected to the first-shield member via the first-connecting arm, the outer tube is connected to the second-shield member via the second-connecting arm, and the at least one motor drives the main shaft and the outer tube to rotate to respectively swing the first-shield member and the second-shield member in the opposite directions synchronously;
      wherein the first-connecting arm includes a first protrusion with a first-reflective surface thereon perpendicular to an extending direction of the first-connecting arm, the second-connecting arm includes a second protrusion with a second-reflective surface thereon perpendicular to an extending direction of the second-connecting arm;
      wherein the thin-film-deposition equipment further comprises:
         a first-distance sensor disposed on side of the first-shield member, wherein the first-distance sensor emits and projects a first-optical beam onto the first-reflective surface when the first-shield member is operated in the shielding state; and
         a second-distance sensor disposed on side of the second-shield member, wherein the second-distance sensor emits and projects a second-optical beam onto the second-reflective surface when the second-shield member is operated in the shielding state.

2. The thin-film-deposition equipment according to claim 1, further comprising two first-position sensors that are disposed adjacent to the outer tube of the shaft seal of the at least one driver for respectively detecting that the outer tube has rotated to a first position and detecting that the outer tube has rotated to a second position, wherein when the outer tube rotates to the first position, the second-shield member is operated into the open state; and when the outer tube rotates to the second position, the second-shield member is operated into the shielding state.

3. The thin-film-deposition equipment according to claim 2, further comprising two second-position sensors that are disposed adjacent to the main shaft of the shaft seal of the at least one driver for respectively detecting that the main shaft tube has rotated to a third position and detecting that the main shaft has rotated to a fourth position; when the main shaft rotates to the third position, the first-shield member is operated into the open state; and when the main shaft rotates to the fourth position, the first-shield member is operated into the shielding state.

4. The thin-film-deposition equipment according to claim 3, further comprising a first-tongue unit and a second-tongue unit, wherein the first-tongue unit is connected to the outer tube; the second-tongue unit is connected to the main shaft; the first-tongue unit rotates with the outer tube to be detected by the first-position sensors; and the second-tongue unit rotates with the main shaft to be detected by the second-position sensors.

5. The thin-film-deposition equipment according to claim 1, wherein each of the first-shield member and the second-shield member is disposed with a plurality of shield positioners; each of the first-connecting arm and the second-connecting arm is disposed with a plurality of arm positioners; the shield positioners of the first-shield member faces the arm positioners of the first-connecting arm, such that to position the first-shield member on the first-connecting arm; and the shield positioners of the second-shield member faces the arm positioners of the second-connecting arm, such that to position the second-shield member on the second-connecting aim.

6. The thin-film-deposition equipment according to claim 5, wherein the shield positioners of the first-shield member and the second-shield member are pins; and the arm positioners of the first-connecting arm and the second-connecting arm are slots.

7. The thin-film-deposition equipment according to claim 1, wherein the at least one driver is two as a first driver and a second driver; the shaft seal of the first driver is connected to the first-shield member, and the at least one motor of the first driver drives and swings the first-shield member; the shaft seal of the second driver is connected to the second-shield member, and the at least one motor of the second driver drives and swings the second-shield member; and the first driver and the second driver respectively drives and swings the first-shield member and the second-shield member to move in the opposite direction and to switch into the open state and the shielding state.

8. A shielding mechanism adapted to a thin-film-deposition equipment, comprising:
  a first-shield member;
  a second-shield member, wherein each of the first-shield member and the second-shield member is formed as a half round plate, and each of the first-shield member and the second-shield member has a bottom surface formed with at least one cavity to reduce weights of the first-shield member and the second-shield member, wherein the first-shield member and the second-shield member arranged on a same plane; and
  a first-connecting arm for carrying the first-shield member; and
  a second-connecting arm for carrying the second-shield member;
  at least one driver comprising:
    a shaft seal that interconnects the first-shield member and the second-shield member; wherein the shaft seal comprises an outer tube and a main shaft contained within the outer tube;
    at least one motor that is connected to the shaft seal and that respectively drives and swings the first-shield member and the second-shield member in opposite directions synchronously to switch between an open state and a shielding state via the shaft seal;
  wherein in the open state, the first-shield member and the second-shield member swing away from each other to have an open space therebetween; and
  wherein in the shielding state, the first-shield member and the second-shield member approach each other to form a round plate as a whole shield to shield a carrier, wherein the first shield member and the second shield member operating in the shielding state are not in direct contact to form a distance therebetween in the same plane that the first shield member and the second shield member are arranged on, and the distance is less than 1 mm;
  wherein the main shaft is connected to the first-shield member via the first-connecting arm, the outer tube is connected to the second-shield member via the second-connecting arm, and the at least one motor drives the main shaft and the outer tube to rotate to respectively swing the first-shield member and the second-shield member in the opposite directions synchronously;
  wherein the first-connecting arm includes a first protrusion with a first-reflective surface thereon perpendicular to an extending direction of the first-connecting arm, the second-connecting arm includes a second protrusion with a second-reflective surface thereon perpendicular to an extending direction of the second-connecting arm;
  wherein the shielding mechanism further comprises:
    a first-distance sensor disposed on side of the first-shield member, wherein the first-distance sensor emits and projects a first-optical beam onto the first-reflective surface when the first-shield member is operated in the shielding state; and
    a second-distance sensor disposed on side of the second-shield member, wherein the second-distance sensor emits and projects a second-optical beam onto the second-reflective surface when the second-shield member is operated in the shielding state.

9. The shielding mechanism according to claim 8, further comprising two first-position sensors that are disposed adjacent to the outer tube of the shaft seal of the at least one driver for respectively detecting that the outer tube has rotated to a first position and detecting that the outer tube has rotated to a second position, wherein when the outer tube rotates to the first position, the second-shield member is operated into the open state; and when the outer tube rotates to the second position, the second-shield member is operated into the shielding state.

10. The shielding mechanism according to claim 9, further comprising two second-position sensors that are disposed adjacent to the main shaft of the shaft seal of the at least one driver for respectively detecting that the main shaft tube has rotated to a third position and detecting that the main shaft has rotated to a fourth position; when the main shaft rotates to the third position, the first-shield member is operated into the open state; and when the main shaft rotates to the fourth position, the first-shield member is operated into the shielding state.

11. The shielding mechanism according to claim 10, further comprising a first-tongue unit and a second-tongue unit, wherein the first-tongue unit is connected to the outer tube; the second-tongue unit is connected to the main shaft; the first-tongue unit rotates with the outer tube to be detected by the first-position sensors; and the second-tongue unit rotates with the main shaft to be detected by the second-position sensors.

12. The shielding mechanism according to claim 8, wherein each of the first-shield member and the second-shield member is disposed with a plurality of shield positioners; each of the first-connecting arm and the second-connecting arm is disposed with a plurality of arm positioners; the shield positioners of the first-shield member faces the arm positioners of the first-connecting arm, such that to position the first-shield member on the first-connecting arm; and the shield positioners of the second-shield member faces the arm positioners of the second-connecting arm, such that to position the second-shield member on the second-connecting arm.

13. The shielding mechanism according to claim 12, wherein the shield positioners of the first-shield member and the second-shield member are pins; and the arm positioners of the first-connecting arm and the second-connecting arm are slots.

14. The shielding mechanism according to claim 8, wherein the at least one driver is two as a first driver and a second driver; the shaft seal of the first driver is connected to the first-shield member, and the at least one motor of the first driver drives and swings the first-shield member; the shaft seal of the second driver is connected to the second-shield member, and the at least one motor of the second driver drives and swings the second-shield member; and the first driver and the second driver respectively drives and swings the first-shield member and the second-shield member to move in the opposite direction and to switch into the open state and the shielding state.

\* \* \* \* \*